United States Patent [19]

Manning

[11] Patent Number: 5,175,127
[45] Date of Patent: Dec. 29, 1992

[54] SELF-ALIGNED INTERLAYER CONTACT PROCESS USING A PLASMA ETCH OF PHOTORESIST

[75] Inventor: Monte Manning, Kuna, Id.

[73] Assignee: Micron Technology, Inc., Boise, Id.

[21] Appl. No.: 892,467

[22] Filed: Jun. 2, 1992

[51] Int. Cl.[5] .................. H01L 21/283; H01L 21/312
[52] U.S. Cl. .................... 437/195; 437/229; 437/984; 156/643; 156/659.1
[58] Field of Search .............. 437/195, 228, 229, 49, 437/52, 984, 190, 193, 191; 148/DIG. 14; 156/643, 644, 653, 657, 659.1

[56] References Cited

U.S. PATENT DOCUMENTS

| | | | |
|---|---|---|---|
| 4,814,041 | 3/1989 | Auda | 156/643 |
| 4,960,729 | 10/1990 | Orbach et al. | 437/195 |
| 4,966,864 | 10/1990 | Pfiester | 437/191 |
| 5,104,822 | 4/1992 | Butler | 437/52 |
| 5,124,280 | 6/1992 | Wei et al. | 437/193 |
| 5,139,904 | 8/1992 | Auda et al. | 430/30 |

Primary Examiner—T. N. Quach
Attorney, Agent, or Firm—Stanley N. Protigal

[57] ABSTRACT

Described is a method of forming a self-aligned contact to an underlying structure with fewer critical patterning steps. The invention uses an isotropic oxygen plasma etch of a resist layer and a subsequent oxide etch to expose an underlying conductive layer such as doped polycrystalline silicon. A second conductive layer formed thereupon contacts the exposed first conductive layer.

16 Claims, 4 Drawing Sheets

SELF-ALIGNED INTERLAYER CONTACT PROCESS USING A PLASMA ETCH OF PHOTORESIST

FIELD OF THE INVENTION

This invention relates to the field of semiconductor manufacture. More specifically, a process is described for forming a contact between two layers of material such as polycrystalline silicon. The inventive process removes at least one nonself-aligned process thereby decreasing the likelihood of producing a malfunctioning device.

BACKGROUND OF THE INVENTION

In the manufacture of semiconductors, several process steps are required to produce a functional die. A wafer of a starting material such as silicon or gallium arsenide is layered with oxide, polycrystalline silicon (poly), nitride, photoresist, and other materials in various configurations, depending on the type and design of the device which is being produced. Each step may require the local deposition, growth, or other formation of one of the above listed materials (patterning), or a blanket layer of the material may be laid down and a pattern etched away with chemicals or abraded away by particles. The regions and layers that are formed can be conductive for conductor and resistor fabrication and can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n-type" denotes silicon that has been doped with atoms having more than four valence electrons (group V or higher), such as arsenic or phosphorus, which introduce negatively charged majority carriers into the silicon, and "p-type" denotes silicon doped with atoms having less than four valence electrons (group III or lower), such as boron, which introduce positively charged majority carriers. The majority charge carrier type is also referred to as conductivity type. "Poly" denotes polycrystalline silicon. "Poly 1" denotes a first poly layer but does not imply a second poly layer, and "Poly 2" denotes a second poly layer. By photomasking, geometries on the order of a micron or less are obtainable for device elements in the IC.

During the fabrication of semiconductor devices using metal oxide semiconductor (MOS) technology, conductive interconnects (or contacts) between different layers or types of conductive material are required to form a circuit. For example, as a MOS transistor is formed in an active area of a silicon substrate, the gate, formed from a first poly layer, must be electrically coupled with other circuitry by a conductor, such as a second layer of poly.

Contacts between layers can comprise two types. In this disclosure, nonself-aligned contacts refer to contacts formed by a process which has little or no tolerance for misalignment of masks, especially if the alignment cannot extend beyond the poly structure to which the mask is being aligned. If the mask is misaligned to a point that it extends beyond the edge of the poly structure, an etch or deposition of a material such as photoresist with the misaligned mask produces a device which does not function properly. A self-aligned process refers to a process which has a high tolerance for misalignment of a mask, especially if the mask can extend beyond the poly structure to which the mask is being aligned.

Many current methods of forming a contact between two conductive layers such as poly requires expanded dimensions of the poly 1 layer in the area of the contact. FIG. 1 is a top view of the poly 1 layer which shows a poly 1 line 10 with expanded dimensions 12. A first layer of poly 10 has been formed on the surface of the substrate (not shown), then a layer of insulator such as oxide (not shown) is formed on the first poly layer 10. An etch through a specific area 14 of the oxide allows a second layer of poly (not shown) formed thereon to contact the first poly layer 10. The expanded dimensions 12 of the bottom poly layer 10 allows for misalignment of the etch 14 through the oxide layer. Misalignment of the etch can result from misalignment of the photomask during the etch step. This is an example of a nonself-aligned process, because the edge of the mask cannot extend beyond the boundary of the poly 1 line without etching into the substrate. After a misaligned etch, a poly 2 layer deposited over the area etched into the substrate would allow the poly 2 layer to contact the substrate.

This method of forming a contact requires a greater amount of substrate surface space due to the increased size 12 of the poly 1 layer 10 in the contact area 14, thereby increasing the size of the device as many of these structures can be formed on the wafer surface. In cases where the etch mask is greatly misaligned, the etch can expose the substrate which can allow the poly 2 layer to make contact with the substrate, and may thereby produce a defective device.

A typical self-aligned process for forming poly 1 to poly 2 contacts to a MOS transistor is shown in the cross sections of FIGS. 2A–2C. As shown in FIG. 2A, a wafer substrate 20 is processed to have field oxide 22, gate oxide 24, a first layer of poly (poly 1) 26, and a patterned layer of photoresist 28. An etch patterns the poly 1 layer 26 to form a transistor gate 30 as shown in FIG. 2B. Next, oxide spacers 32 are formed to offset the transistor source 34 and drain 36 regions of the MOS device from the gate/channel region, and to protect the gate oxide 24 under the spacers 32 during later etching steps. An implant forms source 34 and drain 36 wells in the substrate 20. A method of implanting the source 34 and drain 36 regions is to perform a light implant before the spacers 32 are formed, and a heavier implant after the spacers 32 are formed, thus resulting in a double scalloped well as shown. This implantation method is known in the art, and is not critical to the invention. Other implant methods are known in the art and would be compatible with the inventive process described below. In any case, another layer of oxide 38 is formed, and a second layer photoresist 40 is patterned over the oxide layer 38. The oxide 38 is etched away to selectively expose the poly 1 layer 26, which also removes material from the oxide spacers 32. The spacers 32 thereby prevent an etch through the gate oxide 24 which would allow the poly 2 layer 42 to contact the substrate 20. Finally, as shown in FIG. 2C, a second layer of poly (poly 2) 42 is patterned, thereby forming contacts at 44 between poly 1 26 and poly 2 42. This process is self-aligned because the photomask to deposit the second layer of photoresist 40 can be misaligned over the edge of the poly 1 layer 26 to a degree equal to the width of the spacers 32. As long as the mask is misaligned no more than the width of the spacers 32, the oxide etch will not erode the gate oxide 24 to expose the substrate 20.

Other problems in addition to the possibility of photomask misalignment and increased poly 1 size described above also exist with this type of self-aligned process. For example, the oxide layer 38 formed over the poly 1 26 layer must have a controlled thickness. If the oxide 38 is too thick, then to remove the oxide over the poly 1 layer in the contact area requires such a long etch that the oxide spacers 32 are also etched away, which allows the gate oxide 24 to be etched through, which exposes the substrate 20. The subsequent poly 2 layer 42 would then make contact with the substrate 20, thereby producing a defective device. This process therefore requires larger spacers 32 than would normally be used in simple MOS devices. Typical MOS spacers may not be as large as the worst case misalignment, and this process would therefore require additional processing to build up the spacers.

A process which allows for self-alignment of the contacts independent of the spacer width would solve the problems associated with previous methods of contact formation.

SUMMARY OF THE INVENTION

An object of the invention is to provide a method of opening a contact to a conductive layer which allows for improved control of critical dimensions over previous methods of contact formation.

This object of the invention is realized by defining a structure with a patterned photoresist layer, then eroding the resist with an isotropic plasma etch, for instance with an oxygen plasma. The erosion of the resist layer is easily controlled, as the resist erodes a measurable amount depending on the time of the etch and the energy of the plasma.

For example, a resist layer can be patterned over a layer of poly covered by a layer of oxide. An etch through the oxide and the poly then forms a transistor gate of poly covered by a layer of oxide. A plasma etch of the resist exposes the oxide in the area of the eroded resist. An oxide etch exposes the underlying poly. The resist is removed, and a subsequent poly layer contacts the transistor gate.

DETAILED DESCRIPTION OF THE INVENTION

Figure 1:
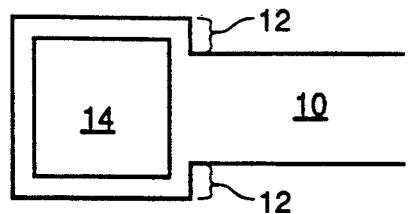
FIG. 1 is a top view of a conventional contact area to an underlying poly layer.
Figure 2A:
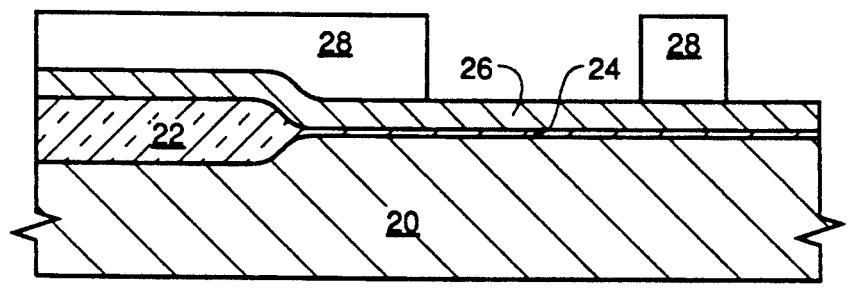
FIGS. 2A–2C are cross sections describing a conventional process to form a contact between a pair of conductive layers.
Figure 2B:
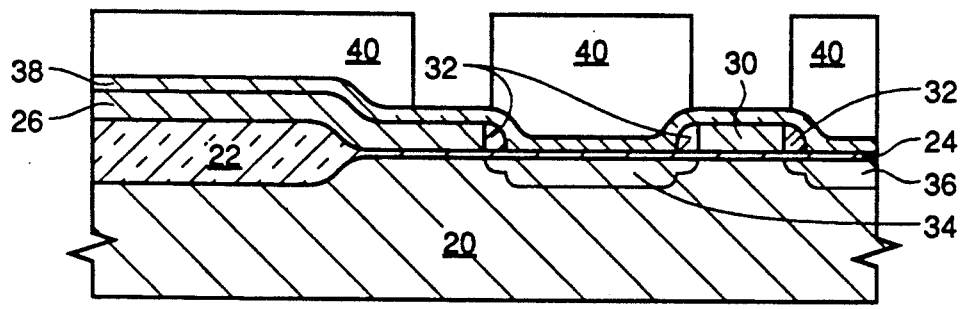
Figure 2C:
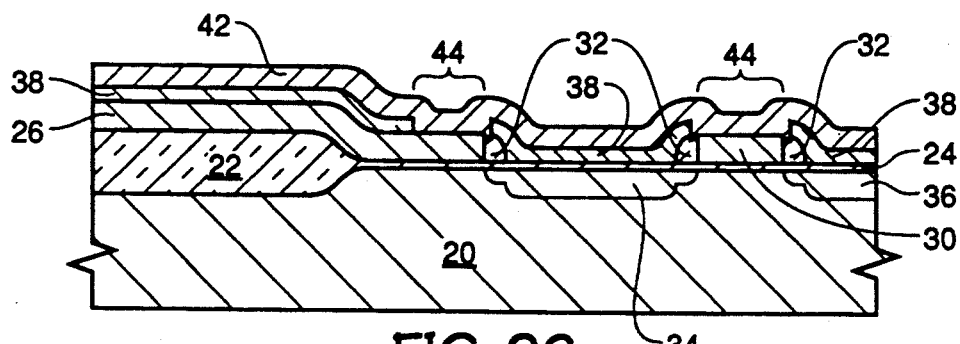
Figure 3:
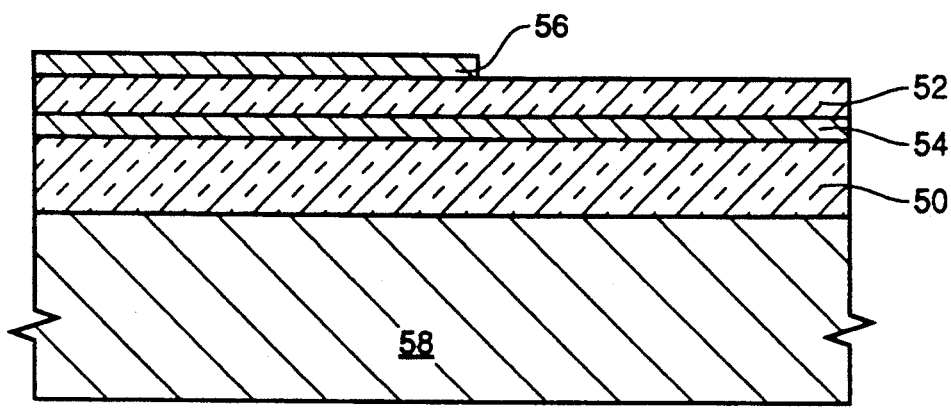
FIG. 3 is a first step in the inventive process, forming a pair of insulating layers and a pair of conductive layers over a substrate.

A method of contact formation using the inventive process is shown in FIGS. 3–10. As shown in FIG. 3, first 50 and second 52 oxide layers are alternated with first 54 and second 56 poly layers. The bottom oxide layer 50 in this embodiment is formed over a substrate of material such as silicon or gallium arsenide, and is thicker than the second oxide layer 52. The first poly layer 54 can be somewhat thicker than the second poly layer 56. Typical thicknesses using current technology are approximately 2500 angstroms (Å) for the first layer of poly 54, 500 Å for the second layer of poly 56, 4000 Å for the bottom oxide 50, and approximately 1000 Å for the second oxide layer 52. Optimum thicknesses may vary depending on the design of the device, the specific use of the invention, and the current technology.

Figure 4:
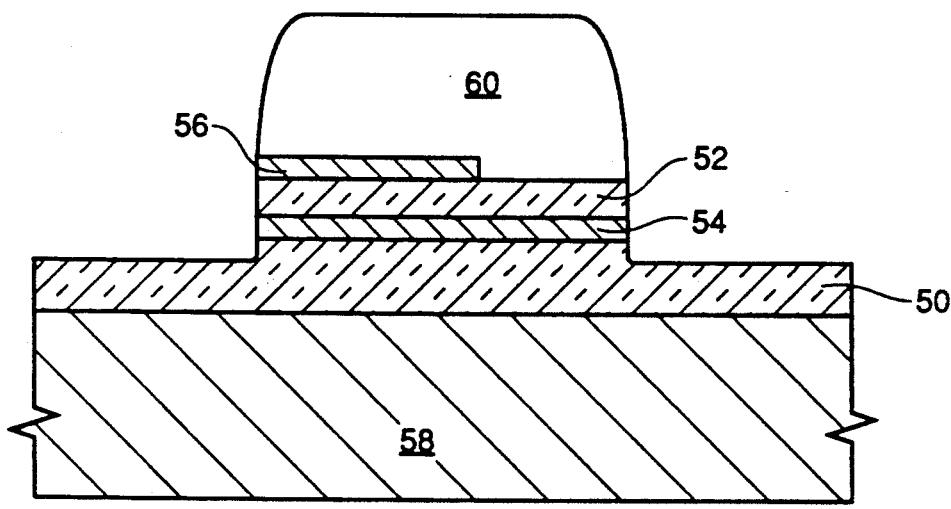
FIG. 4 shows the formation of a patterned resist layer and a subsequent etch over the FIG. 3 structure.

As shown in FIG. 4, a patterned layer of photoresist 60 is formed over the oxide 50, 52 and poly 54, 56 layers. The resist 60 defines the edges of a feature to be formed underneath, and covers those areas where contact will be made between the first poly layer 54 and a subsequently formed poly layer. The distance targeted from the edge of the poly 2 layer 56 to the edge of the resist 60 should be enough to allow for possible misalignment of the resist mask. The top three layers 56, 52, 54 are then etched, the etch stopping at the bottom oxide layer 50 that covers the substrate 58. Some of this oxide 50 may be removed, depending on whether an overetch occurs.

Figure 5:
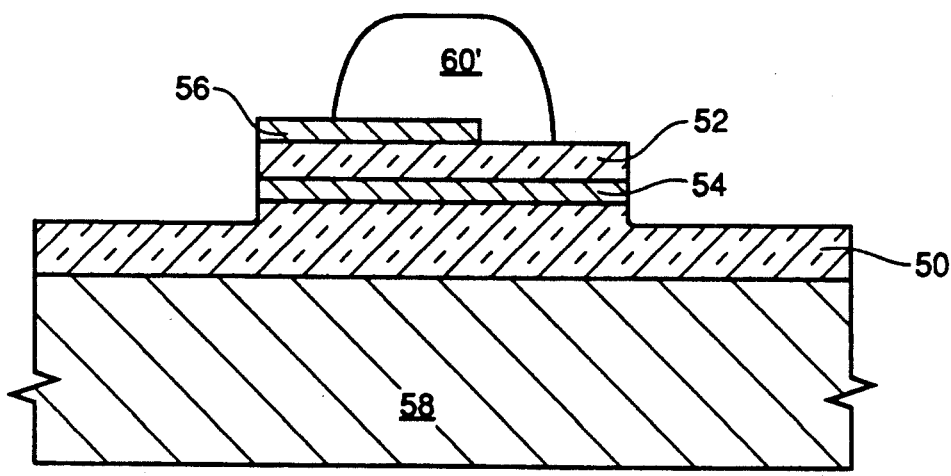
FIG. 5 shows the FIG. 4 structure after an isotropic plasma etch of the resist layer.

After the etch, a portion of the resist 60 is eroded, for example by subjecting the resist to an oxygen plasma, thereby resulting in the narrower and thinner resist 60' of FIG. 5. It is known that photoresist is isotropically eroded resulting in a thinner and narrower resist layer, without any effect to the exposed oxide and poly.

Figure 6:
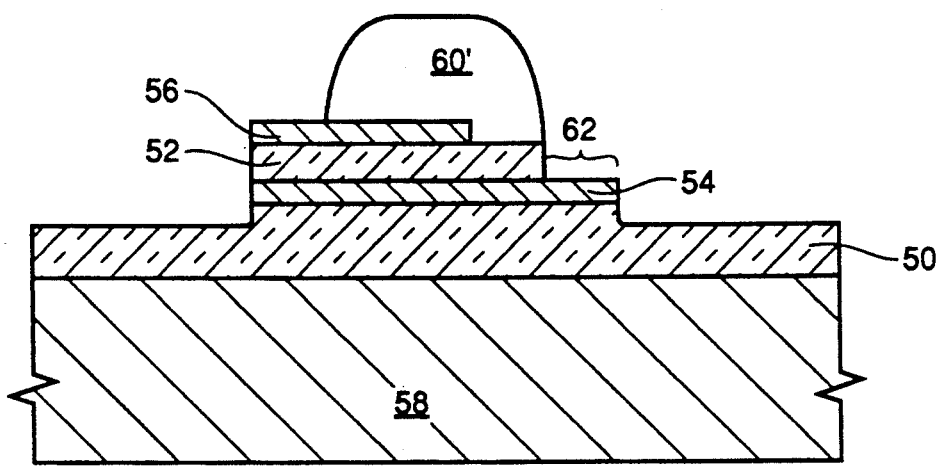
FIG. 6 shows the FIG. 5 structure after an oxide etch.

Referring to FIG. 6, an oxide etch is performed thereby removing the exposed portion of the second oxide layer 52, and also a portion of the exposed first oxide layer 50. The first oxide layer 50, therefore, must be thick enough to prevent the substrate 58 from being exposed and etched while allowing the exposed second layer of oxide 52 to be completely removed. By removing the exposed second layer of oxide 52, a portion 62 of the first poly layer 54 is exposed. The photoresist layer 60' is then removed. Note that the poly 2 layer 56 will function simply as an etch stop during the oxide spacer etch, and materials other than the poly described may function in this capacity.

Figure 7:
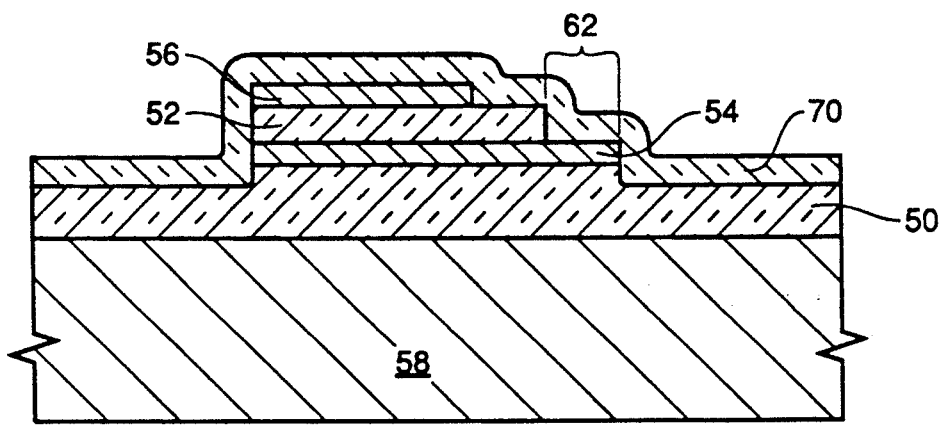
FIG. 7 shows the FIG. 6 structure after the formation of a blanket insulative layer.
Figure 8:
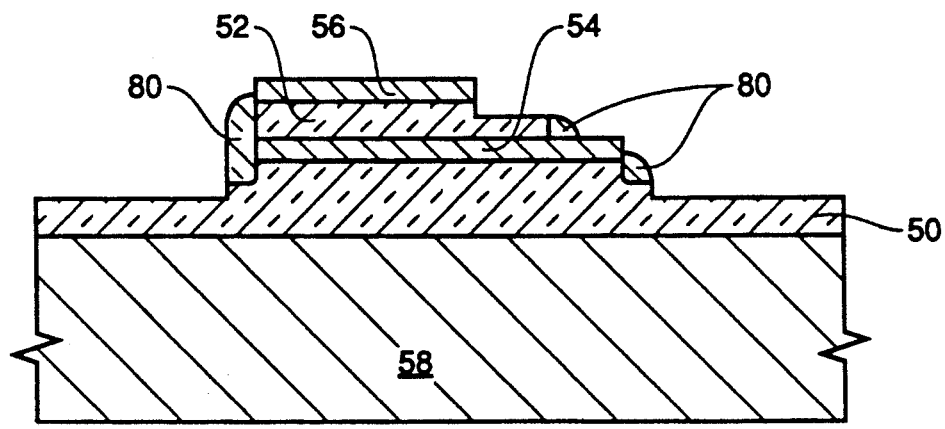
FIG. 8 shows the FIG. 7 structure after an etch of the insulative layer to form spacers.

Referring to FIG. 7, a blanket layer of oxide 70 is formed over the surface, then etched, thereby resulting in the structure of FIG. 8 having oxide spacers 80. A portion of the underlying oxide 50, 52 is typically removed during the spacer etch.

Figure 9:
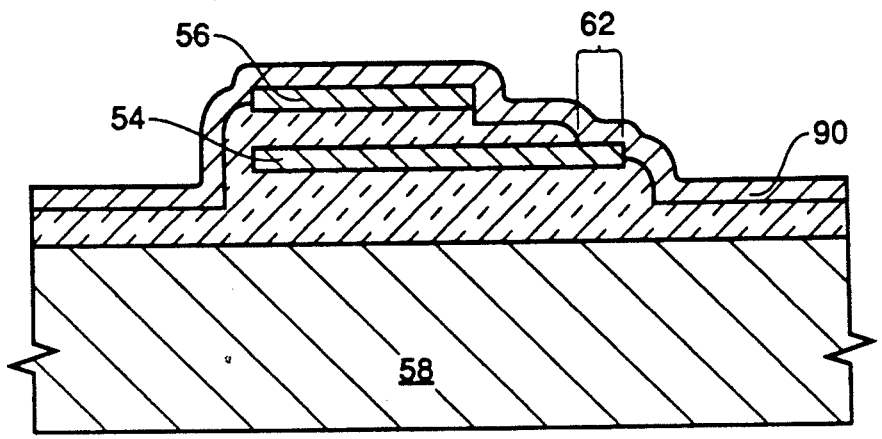
FIG. 9 shows the FIG. 8 structure after the formation of a conductive layer to contact the bottom conductor.
Figure 10:
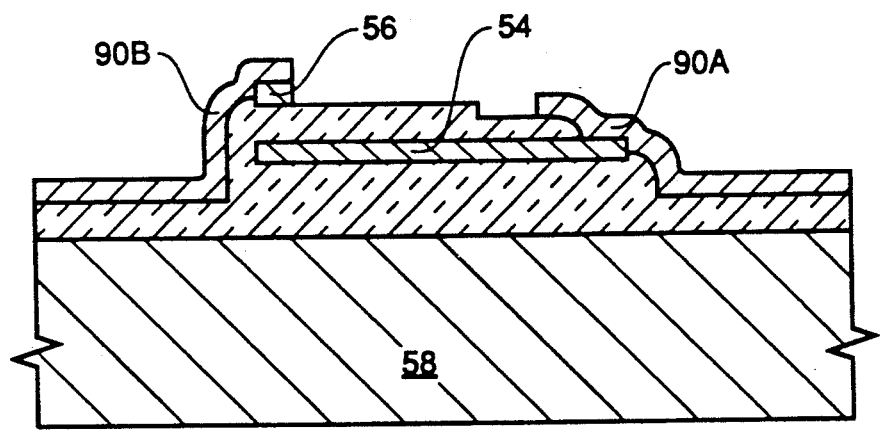
FIG. 10 shows the FIG. 9 structure after a patterned etch of the top conductor.

As shown in FIG. 9, a conductive layer 90 of poly, metal, or other workable materials formed over the surface contacts the first poly layer 54 at the exposed area 62. Patterning conductive layer 90 results in the structure of FIG. 10. The spacers formed earlier prevent structure 90B from contacting poly 1 54. The spacers are optional, depending on the design of the cell.

By timing the plasma etch to erode the resist 60 as shown in FIG. 4 the amount of poly 1 exposed 62 can be accurately controlled. As described above, in conventional processes the poly 1 layer is exposed by forming a patterned layer of resist, then etching the oxide to expose the underlying poly. The inventive process removes the need for this patterning, instead employing the resist used to define the edges of the poly 1 layer, thereby allowing for a self-aligned process of contact formation. A noncritical patterning however, is required for the second poly layer 56. The distance targeted from the edge of the poly 2 layer to the right edge (in the embodiment described above) of a subsequent resist layer should be great enough to allow for possible misalignment of the resist mask.

While this invention has been described with reference to illustrative embodiments, this description is not meant to be construed in a limiting sense. Various modifications of their illustrative embodiments, as well as additional embodiments of the invention, will be apparent to persons skilled in the art upon reference to this description. For example, other dielectric materials other than oxide may be used, and conductors other than polycrystalline silicon, such as a metal, would function as conductors. It is therefore contemplated that the appended claims will cover any such modifications or embodiments as fall within the true scope of the invention.

I claim:

1. A method of forming a contact during the manufacture of a semiconductor device, comprising the steps of:
   a) forming a first insulative layer over a semiconductor substrate;
   b) forming a first conductive layer over said first insulative layer;
   c) forming a second insulative layer over said first conductive layer;
   d) patterning an etch stop layer over said insulative layer;
   e) covering at least a portion of said etch stop layer and a portion of said second insulative layer with a patterned layer of photoresist and leaving other areas of said second insulative layer exposed;
   f) removing any exposed portions of said etch stop layer and said exposed areas of said second insulative layer and removing at least a portion of said first conductive layer underneath said exposed second insulative layer;
   g) isotropically removing said photoresist to expose additional portions of said second insulative layer;
   h) etching through said additionally exposed portions of said second insulative layer to expose said first conductive layer underneath said additionally exposed portions of said second insulative layer; and
   i) forming a second conductive layer over said exposed area of said first conductive layer, thereby contacting said first conductive layer with s id second conductive layer.

2. The method of claim 1 wherein said etch stop layer comprises polycrystalline silicon.

3. The method of claim 1 wherein said isotropic removal of said photoresist comprises the use of a plasma etch.

4. The method of claim 3 wherein said plasma etch step is performed in an environment which comprises oxygen, wherein said plasma etch step removes exposed photoresist thereby resulting in a thinner and narrower photoresist layer while leaving said insulation and conductive layers substantially unaffected.

5. The method of claim 1 wherein said insulative layers comprise oxide.

6. The method of claim 1 wherein said first conductive layer comprises polycrystalline silicon.

7. The method of claim 1 wherein said second conductive layer comprises polycrystalline silicon.

8. The method of claim 1 wherein said second conductive layer comprises metal.

9. A method of electrically contacting two layers of conductive material during the manufacture of a semiconductor die, comprising the steps of:
   a) doping a semiconductor substrate;
   b) forming a first layer of insulation over said substrate;
   c) forming a first conductive layer over said first insulative layer;
   d) forming a second layer of insulation over said first conductive layer;
   e) patterning a etch stop layer over said second layer of insulation;
   f) patterning a layer of photoresist over said etch stop layer and said second layer of insulation;
   g) etching through said etch stop layer and said second layer of insulation;
   h) etching through said first conductive layer;
   i) eroding said photoresist, thereby decreasing a width of said photoresist and exposing a portion of said second insulative layer;
   j) etching through said second insulative layer to expose a portion of said first conductive layer;
   k) forming a second conductive layer over said first conductive layer to provide electrical contact therebetween.

10. The method of claim 9, wherein said etch stop layer comprises polycrystalline silicon.

11. The method of claim 9, further comprising the steps of:
   a) forming a substantially vertical surface during said etching steps, said vertical surface comprising said etch stop layer, said second insulative layer, and said first conductive layer; and
   b) forming spacers over said vertical surface thereby insulating said vertical surface of said first conductive layer.

12. The method of claim 9 wherein said first and second insulative layers comprise oxide.

13. The method of claim 9 wherein said first and second conductive layers comprise polycrystalline silicon.

14. The method of claim 9 wherein said second conductive layer comprises metal.

15. The method of claim 9 wherein said resist erosion is performed by a plasma etch.

16. The method of claim 15 wherein said plasma etch is performed in an environment which comprises oxygen, wherein said plasma etch step removes exposed photoresist thereby resulting in a thinner and narrower photoresist layer while leaving said insulation and conductive layers substantially unaffected.

* * * * *